(12) United States Patent
Zhu et al.

(10) Patent No.: US 10,888,004 B2
(45) Date of Patent: Jan. 5, 2021

(54) DISPLAY BOX AND DISPLAY DEVICE

(71) Applicant: Yungu (Gu'an) Technology Co., Ltd., Langfang (CN)

(72) Inventors: Zhaoji Zhu, Langfang (CN); Liwei Ding, Langfang (CN); Fu Liao, Langfang (CN); Hongqi Hou, Langfang (CN); Xuebin Li, Langfang (CN); Desong Yan, Langfang (CN); Yuhua Wu, Langfang (CN); Liuyang Wang, Langfang (CN); Kanglong Sun, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 14 days.

(21) Appl. No.: 16/380,375

(22) Filed: Apr. 10, 2019

(65) Prior Publication Data
US 2019/0239366 A1    Aug. 1, 2019

Related U.S. Application Data

(63) Continuation of application No. PCT/CN2018/118490, filed on Nov. 30, 2018.

(30) Foreign Application Priority Data

May 21, 2018    (CN) .......................... 2018 2 0758884

(51) Int. Cl.
*H05K 1/00*        (2006.01)
*H05K 5/00*        (2006.01)
(Continued)

(52) U.S. Cl.
CPC ......... *H05K 5/0017* (2013.01); *G06F 1/1652* (2013.01); *H05K 5/0226* (2013.01)

(58) Field of Classification Search
CPC ...... H05K 5/0017; H05K 5/03; H05K 5/0226; G06F 1/1652
(Continued)

(56) References Cited

U.S. PATENT DOCUMENTS

| 4,286,832 A | 9/1981 | Spevak |
| 6,256,837 B1 * | 7/2001 | Lan ..................... B60R 11/0235 |
| | | 16/334 |

(Continued)

FOREIGN PATENT DOCUMENTS

| CN | 101447146 A | 6/2009 |
| CN | 202097727 U | 1/2012 |

(Continued)

OTHER PUBLICATIONS

PCT International Search Report dated Feb. 27, 2019 in International Application No. PCT/CN2018/118490.
(Continued)

*Primary Examiner* — Binh B Tran
(74) *Attorney, Agent, or Firm* — Rimon PC

(57) ABSTRACT

The display box includes a box body including an upper cover, a rotating shaft rotatably connected with the upper cover, and a support plate disposed on the upper surface of the upper cover via the rotating shaft to fix an exhibit. The support plate is rotatable with the rotating shaft to make the exhibit be at a preset angle with respect to the upper surface.

20 Claims, 3 Drawing Sheets

(51) Int. Cl.
  H05K 5/02  (2006.01)
  G06F 1/16  (2006.01)

(58) Field of Classification Search
  USPC .......................................................... 361/749
  See application file for complete search history.

(56) References Cited

U.S. PATENT DOCUMENTS

| | | | | |
|---|---|---|---|---|
| 6,275,376 | B1* | 8/2001 | Moon | G06F 1/162 |
| | | | | 345/168 |
| 7,475,452 | B2* | 1/2009 | Yeh | F16M 11/08 |
| | | | | 16/367 |
| 8,300,391 | B2* | 10/2012 | Hu | G06F 1/1681 |
| | | | | 248/917 |
| 8,797,735 | B2* | 8/2014 | Ge | G06F 1/1616 |
| | | | | 361/679.55 |
| 9,229,475 | B2* | 1/2016 | Zhao | G06F 1/16 |
| 9,692,948 | B2* | 6/2017 | Yano | G03B 17/04 |
| 2019/0339742 | A1* | 11/2019 | Jia | G06F 1/1681 |

FOREIGN PATENT DOCUMENTS

| | | |
|---|---|---|
| CN | 202225194 U | 5/2012 |
| CN | 202455429 U | 9/2012 |
| CN | 103569480 A | 2/2014 |
| CN | 104859770 A | 8/2015 |
| CN | 205994127 U | 3/2017 |
| CN | 107048882 A | 8/2017 |

OTHER PUBLICATIONS

PCT Written Opinion dated Feb. 27, 2019 in International Application No. PCT/CN2018/118490.

\* cited by examiner

DISPLAY BOX AND DISPLAY DEVICE

CROSS-REFERENCE TO RELATED APPLICATIONS

This application is a continuation of International Application No. PCT/CN2018/118490 filed on Nov. 30, 2018, which claims priority to Chinese patent application No. 201820758884.0 filed on May 21, 2018. Both applications are incorporated herein by reference in their entireties.

TECHNICAL FIELD

The application relates to the field of display, and in particularly to a display box and a display device.

BACKGROUND

At present, display boxes are often used in exhibitions. A support frame is set on a display box, and an exhibit is placed on the support frame of the display box. However, the support frame is often fixed on the display box and is at a preset angle with respect to the display box, which causes the display box to be too large in size and unstable in structure. Therefore, transportation of display boxes is adversely impacted, and display boxes and exhibits are sometimes damaged during the transportation process, resulting in extension of exhibitions.

Therefore, it is urgent to provide a display box that is more stable in structure and easier to be transported.

SUMMARY

Embodiments of the present application provide a display box and a display device, which solves the problem that the display box is too large in size and unstable in structure.

An embodiment of the present application provides a display box including a box body including an upper cover; a rotating shaft rotatably connected with the upper cover, and a support plate disposed on the upper surface of the upper cover via the rotating shaft to fix an exhibit, the support plate being rotatable with the rotating shaft to make the exhibit be at a preset angle with respect to the upper surface.

In an embodiment of the present application, the upper surface of the upper cover is further provided with a first groove, and the support plate is located in the first groove when the preset angle is 0°.

In an embodiment of the present application, the rotating shaft includes a plurality of shaft necks located at both ends of the rotating shaft; the box body further includes two rotating shaft fixed blocks, a second groove is disposed on each of the two rotating shaft fixed blocks respectively, and the second groove cooperates with each shaft neck at both ends of the rotating shaft respectively to make the shaft necks be disposed on the lower surface of the upper cover, the upper surface of the upper cover is further provided with an opening, and the support plate extends through the opening to connect with the rotating shaft.

In an embodiment of the present application, the exhibit includes a display screen disposed above the support plate; the box body further includes a main board disposed in the upper cover, and the main board is connected with the display screen to drive the display screen to display.

In an embodiment of the present application, a slit is defined on the support plate; the display screen is connected with a flexible printed circuit; and the flexible printed circuit extends through the slit to connect with the main board.

In an embodiment of the present application, a first card slat and a second card slot are disposed along a circumferential direction of the rotating shaft with a preset distance; the box body further includes a first spring pin component disposed in the upper cover; the first spring pin component cooperates with the first card slot when the preset angle is 0°; the first spring pin component cooperates with the second card slot when the preset angle is greater than 0°.

In an embodiment of the present application, the first card slot and the second card slot are located in a middle part of the circumferential surface of the rotating shaft.

Optionally, in another embodiment, the first card slot and the second card slot are located at one end of the rotating shaft, and the rotating shaft has a third card slot and a fourth card slot defined on another end thereof; the box body further includes a second spring pin component, the second spring pin component cooperates with the third card slot when the preset angle is 0°; the second spring pin component cooperates with the fourth card slot when the angle is greater than 0°.

In an embodiment of the present application, the first spring pin component includes at least one spring pin and at least one spring corresponding to the spring pin; one end of the spring pin cooperates with the first card slot or the second card slot, and the other end of the spring pin cooperates with the spring.

In an embodiment of the present application, a shape of a first section of the one end of the spring pin is semicircular, a shape of the other end of the spring pin is cylindrical, a shape of a second section of the first card slot and the second card slot is semicircular, and the first section and the second section are perpendicular to the axis of the rotating shaft.

In an embodiment of the present application, when the support plate rotates upward, the first card slot rotates away from the spring pin, and the second card slot rotates toward the spring pin, when the spring pin is snapped into the second card slot, the spring is compressed, and the support plate is confined, so that the support plate is at a certain angle with respect to the upper cover. In an embodiment of the present application, the box body further includes a lower cover, a mobile power source and a power source fixing cover, and the lower cover is located under the upper cover, a third groove for placing the mobile power source is disposed on the power source fixing cover, and the lower cover and the power source fixing cover are respectively provided with a magnet thereon, when there is no power supply, the power source fixing cover on which the mobile power source is placed is absorbed onto the lower cover by the magnet.

Embodiments of the present application further provide a display device including the display box described above; and an exhibit disposed on the support plate of the display box.

In the display box provided by the embodiments of the present application, the support plate is disposed on the box body via the rotating shaft, so that the support plate may be placed in the first groove during a transportation process, and may be presented at a certain angle during a display process, thereby the support plate is not easy to be bumped or damaged during the transportation process, and the display box is relatively easy to be transported. In the display process, a setting of the preset angle is also convenient for visitors to visit the exhibits at a comfortable angle.

DETAILED DESCRIPTION

The following clearly describes the technical solutions in the embodiments of the present application with reference to the accompanying drawings in the embodiments of the present application. Apparently, the described embodiments are merely some but not all of the embodiments of the present application. All other embodiments obtained by persons of ordinary skill in the art based on the embodiments of the present application without creative efforts shall fall within the protection scope of the present application.

Figure 1:
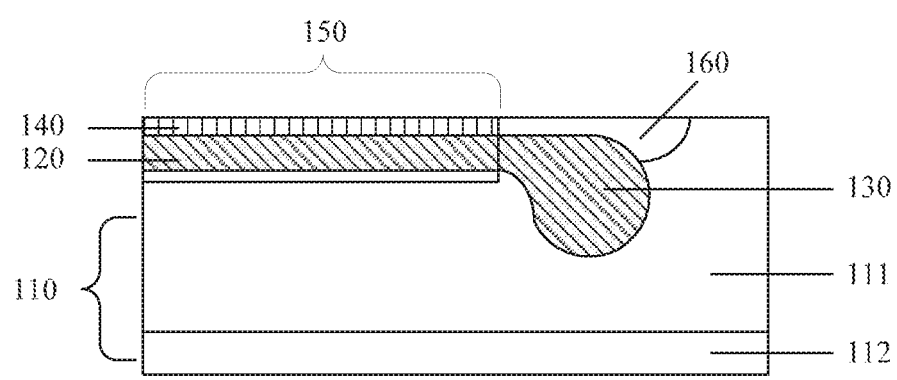
FIG. 1 is a sectional view illustrating a display box according to the present application.

FIG. 1 is a sectional view illustrating a display box according to the present application.

As shown in FIG. 1, the display box includes a box body 110, a support plate 120, and a rotating shaft 130. The box body 110 includes an upper cover 111, and the rotating shaft 130 is rotatably connected with the upper cover 111, the support plate 120 is disposed on the upper surface of the upper cover 111 via the rotating shaft 130 to fix an exhibit 140 and be rotatable with the rotating shaft 130 to make the exhibit 140 be at a preset angle with respect to the upper surface of the upper cover.

According to an embodiment of the present application, the support plate 120 is disposed on the box body 110 via the rotating shaft, so that the support plate 120 may be at a preset angle with respect to the upper surface of the box body 110. During a transportation process, the support plate 120 may be at 0° with the upper surface of the upper cover 111, so that the support plate 120 is not easy to be bumped and damaged during the transportation process, and the display box is relatively easy to be transported. During a display process, the support plate 120 may be at a certain angle with respect to the upper surface of the upper cover 111, so that visitors may visit the exhibit at a comfortable angle.

As shown in FIG. 1, the upper surface of the upper cover 111 is further provided with a first groove 150, and the support plate 120 is located in the first groove 150 when the preset angle is 0°.

Specifically, the box body 110 may include the upper cover 111 and other component 112, and the other component 112 may be a lower cover, for example, the upper cover 111 and the lower cover may cooperate with each other to form a complete box body. Of course, the body box 110 may further include other components, and the embodiments of the present application are not limited thereto.

The support plate 120 and the rotating shaft 130 may be integrally formed, or may be separately formed and then connected together, and the embodiments of the present application are not limited thereto. The material of the support plate 120 may be polymer material, for example, Polycarbonate (PC), an acrylic plate or the like, and the material of the rotating shaft 130 may be polymer material and may also be metal material.

The exhibit 140 may be a mobile phone, a tablet or a display screen and the like, and the exhibit 140 may be fixed on the support plate 120. For example, the double-sided tape may be selected to fix the exhibit 140 on the support plate 120, or a magnetic induction chip may be designed in the exhibit such as a mobile phone, a tablet or the like, and a magnetic strip or a metal strip may be disposed in the support plate 120, and the exhibit 140 is fixed on the support plate 120 by a magnetic attraction, and the embodiments of the present application are not limited thereto. In embodiments of the present application, the exhibit 140 may be fixed on the upper surface of the support plate 120 or may be fixed on the lower surface of the support plate 120. When the exhibit 140 is fixed on the lower surface of the support plate, the exhibit 140 fixed on the support plate 120 may be protected from being worn or damaged during the transportation process.

The preset angle may be an angle at which the support plate 120 is opened when the support plate 120 is opened, that is, an angle between the support plate 120 and the upper surface of the box body 110, for example, the angle to be opened may be greater than or equal to 0° and less than 180°. The preset angle may be determined according to a position where the exhibit 140 is placed, a height of a booth where the display box is placed, and a size of the display box, so as to try to make visions of exhibitors satisfied. For example, when the exhibit 140 is fixed on the upper surface of the support plate 120, the preset angle may be greater than or equal to 0° and less than 90°; when the exhibit 140 is fixed on the lower surface of the support plate 120, the preset angle may be greater than or equal to 90° and less than 180°. In addition, during the transportation process, the preset angle may be 0°, and the support plate 120 is placed in the first groove, which reduces the volume of the display box, so that the support plate 120 is not easy to be bumped and damaged during the transportation process, and then the display box is easier to be transported. The exhibit 140 may be fixed on the support plate 120 to be transported, of course, the exhibit 140 and the display box may also be separated and be transported separately. During the display process, the preset angle may be 60° or 120°, which is convenient for visitors to visit the exhibit 140 at a comfortable angle.

Figure 2A:
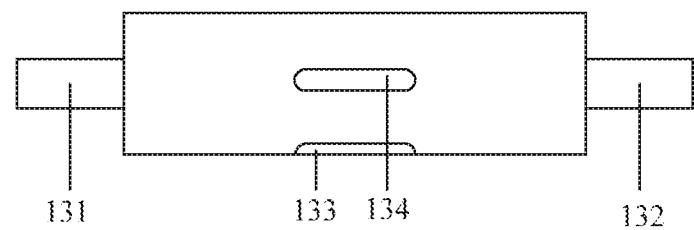
FIG. 2A is a front view illustrating a rotating shaft according to the present application.

FIG. 2A is a front view illustrating a rotating shaft according to the present application.

Figure 2B:
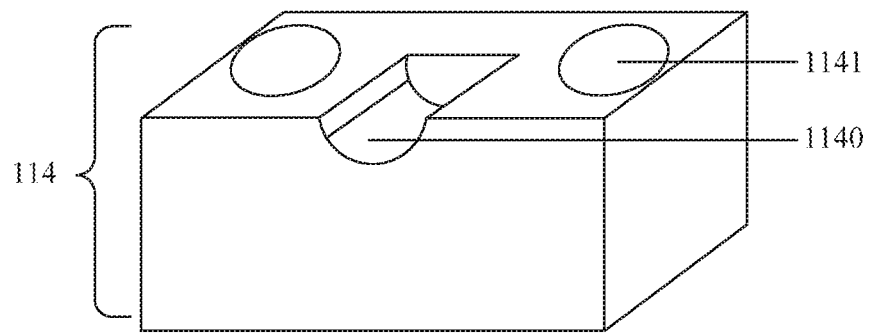
FIG. 2B is a schematic structural diagram illustrating a rotating shaft fixed block according to the present application.

FIG. 2B is a schematic structural diagram illustrating a rotating shaft fixed block according to the present application. Since two rotating shaft fixed blocks in the present application are similar in structure, only one rotating shaft fixed block is shown in FIG. 2B.

As shown in FIG. 1, FIG. 2A and FIG. 29, the rotating shaft 130 includes a shaft neck 131 and a shaft neck 132, and the shaft neck 131 and the shaft neck 132 are located at two ends of the rotating shaft 130; the box body 110 further includes two rotating shaft fixed blocks 114, and a second groove 1140 is disposed on each of the two shaft fixed blocks respectively, and the second groove 1140 cooperates with each shaft neck at both ends of the rotating shaft 130 respectively, so as to dispose the shaft neck 131 and the shaft neck 132 on the lower surface of the upper cover 111. An opening 160 is further disposed on the upper surface of the upper cover 111, and the support plate 120 extends through the opening 160 to connect with the rotating shaft 130.

As shown in FIG. 1, FIG. 2A and FIG. 2B, an opening 160 is further disposed on the right side of the first groove ISO, and the support plate 120 and the rotating shaft 130 may be loaded into a corresponding rotating shaft structure from an inner side of the upper cover 111, and then extend from the opening 160. The rotating shaft 130 includes the shaft neck 131 and the shaft neck 132, a total length of the rotating shaft 130 is greater than a length of the opening, so that the upper surface of the upper cover 111 at the opening 160 may block the shaft neck 131 and the shaft neck 132 in the upper cover 111. As shown in FIG. 2B, the box body 110 includes two rotating shaft fixed blocks 114 disposed in the upper cover 111, and two second grooves 1140 are disposed on both middle parts of the two rotating shaft fixed blocks 114. The two second groove 1140 cooperate with the shaft neck 131 and the shaft neck 132 at the two ends of the rotating shaft 130 respectively. Threaded connection holes 1141 may be disposed on the two rotating shaft fixed blocks 114, and may be connected with the upper cover 111 by a threaded connection and the like. That is, the two rotating shaft fixed blocks 114 and the upper surface of the upper cover 111 may be used to restrict that the shaft necks at both ends of the rotating shaft 130 may not move up and down, and may rotate in the two second groove 1140, thereby the rotating shaft 130 is fixed on the upper surface of the upper cover 111. Of course, the rotating shaft 130 may also be connected with the upper cover 111 by other connection mode, for example, a hinge connection, and the embodiments of the present application are not limited thereto.

According to an embodiment of the present application, the exhibit 140 includes a display screen disposed above the support plate 120; the box body 110 further includes a main board disposed in the upper cover 111, and the main board is connected with the display screen to drive the display screen to display.

Specifically, the display screen may be a flexible display screen or any other display screen, which may be located above the support plate 120 and may also be located below the support plate 120, and the embodiments of the present application are not limited thereto.

The box body 110 further includes a main board disposed in the upper cover 111, and the main board is connected with the display screen to drive the display screen to display. For example, the main board may include a control module, and the control module may be connected with the display screen through a signal line and control the display screen by a control instruction. When the display screen receives the control instruction sent from the control module, the display screen may display according to the control instruction. In an embodiment of the present application, the control module may be a microcontroller such as a single chip microcomputer, an Advanced RISC Machines (ARM) and the like, and may also be other microprocessors, and the embodiments of the present application are not limited thereto.

According to an embodiment of the present application, when the exhibit is a display screen, the display screen may not display a content autonomously, and may need to be controlled by the main board in the upper cover to display the content. Moreover, currently a display of the display screen still needs to be fixed relatively with a base or a display box, so that the display screen is bulky when carried, and is easy to be damaged during the transportation process. The display box of the present application may maintain the display of the display screen, and further may make the display screen relatively convenient to be carried, relatively easy to be transported, and a damage rate to be reduced.

According to an embodiment of the present application, a slit is defined on the support plate 120; the display screen is connected with a flexible printed circuit; and the flexible printed circuit extends through the slit to connect with the main board.

Specifically, the display screen may be connected with the Flexible Printed Circuit (FPC), and the display screen may be fixed above the support plate 120 by using a double-sided tape and the like, and the FPC may extend to the below of the support board 120 through the slip on the support plate 120. Then, the display screen, the FPC, and the support plate may be assembled together on the upper cover 111 from an inner side of the upper cover 111, and the FPC may be connected with the main board through a connector.

According to an embodiment of the present application, a first card slot 133 and a second card slot 134 are disposed along a circumferential direction of the rotating shaft 130 with a preset distance; the box body 110 further includes a first spring pin component disposed in the upper cover 111; the first spring pin component cooperates with the first card slot 133 when the preset angle is 0°; the first spring pin component cooperates with the second card slot 134 when the preset angle is greater than 0°.

Specifically, not only the first card slot 133 and the second card slot 134 may be disposed along the circumferential direction of the rotating shaft 130 with a preset distance, but also a third card slot and a fourth card slot may be disposed, and different card slots may control the angle between the support plate 120 and the upper cover 111, and structures of the card slots may be similar. The preset distance corresponds to the preset angle, for example, the preset distance and the preset angle may be proportional. When the display box is transported, the preset angle is 0°, and the display box is relatively small in size and relatively easy to be transported. At this time, the first spring pin component cooperates with the first card slot 133; when the display box is opened to display the exhibit, the first spring pin component cooperates with the second card slot 134, so that the support plate 120 is fixed for visitors to visit the exhibit.

In an embodiment of the present application, the first card slot 133 and the second card slot 134 may be located in a middle part of the circumferential surface of the rotating shaft 130, so that the support of the support plate is relatively stable.

Optionally, in another embodiment of the present application, the first card slot and the second card slot are located at one end of the rotating shaft 130, and the rotating shaft has a third card slot and a fourth card slot defined on another end thereof, and the box body 110 further includes a second spring pin component. The second spring pin component cooperates with the third card slot when the preset angle is 0°; the second spring pin component cooperates with the fourth card slot when the preset angle is greater than 0°.

Specifically, shapes of the first card slot, the second card slot, the third card slot, and the fourth card slot may be similar, positions of the third card slot and the fourth card slot and positions of the first card slot and the second card slot may also be similar. For example, the third card slot and the first card slot may be disposed on a straight line parallel to the axis of the rotating shaft 130, and a distance between the third card slot and the axis of the rotating shaft 130 may also be equal to a distance between the first card slot and the axis of the rotating shaft 130, so that the support of the support board is relatively stable.

The first spring pin component cooperates with the first card slot, and the second spring pin component cooperates with the third card slot when the preset angle is 0°; the first spring pin component cooperates with the second card slot, and the second spring pin component cooperates with the fourth card slot when the preset angle is greater than 0°.

Alternatively, the first card slot and the second card slot may be disposed in the middle part of the rotating shaft 130 and may also be set at both ends of the rotating shaft 130. Of course, they may further be located in other positions of the rotating shaft 130, and the embodiments of the present application are not limited thereto.

According to an embodiment of the present application, the first spring pin component includes at least one spring pin and at least one spring corresponding to the spring pin; one end of the spring pin cooperates with the first card slot 133 or the second card slot 134, and the other end of the spring pin cooperates with the spring. A shape of a first section of the one end of the spring pin is semicircular, a shape of the other end of the spring pin is cylindrical, and a shape of a second section of the first card slot and the second card slot is semicircular, and the first section and the second section are perpendicular to the axis of the rotating shaft.

Specifically, the first spring pin component may include a spring pin and a spring, and may also include two spring pins and two springs, one spring pin corresponds to one spring, or may include a spring pin and two springs, one spring pin corresponds to two springs, and the embodiments of the present application are not limited thereto. The shape of one end of the spring pin may be cylindrical, and the spring may be sleeved on the cylindrical end of the spring pin. A shape of a section perpendicular to the axis of the rotating shaft 130 of the other end of the spring pin may be semicircular to cooperate with the first card slot 133 or the second card slot 134, and a shape of a section perpendicular to the axis of the rotating shaft 130 of the first card slot 133 and the second card slot 134 may also be semicircular. For example, the shape of the other end of the spring pin may be approximately hemispherical, approximately semi-ellipsoidal and the like. Of course, the embodiments of the present application does not limit the shape of the spring pin, and does not limit the shape of the first card slot 133 and the second card slot 134, as long as the spring pin cooperates with the first card slot 133 and the second card slot 134. A structure of the second spring pin component may be similar to a structure of the first spring pin component, and will not be described redundantly herein.

Figure 2C:
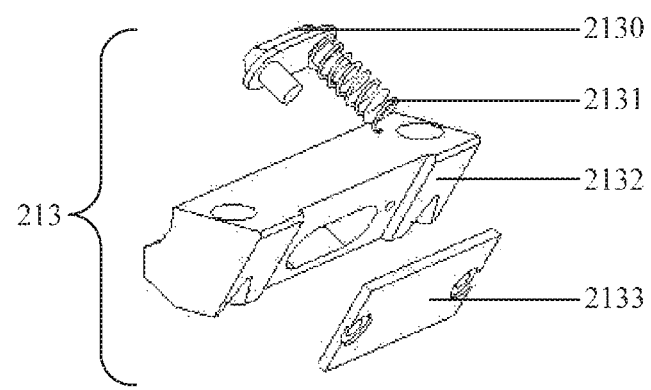
FIG. 2C is an exploded view illustrating a first spring pin component according to the present application.

FIG. 2C is an exploded view illustrating a first spring pin component according to the present application. There are two springs in FIG. 2C, one spring is a spring 2131, the other spring is not shown, and the spring not shown is similar to the spring 2131.

Figure 3:
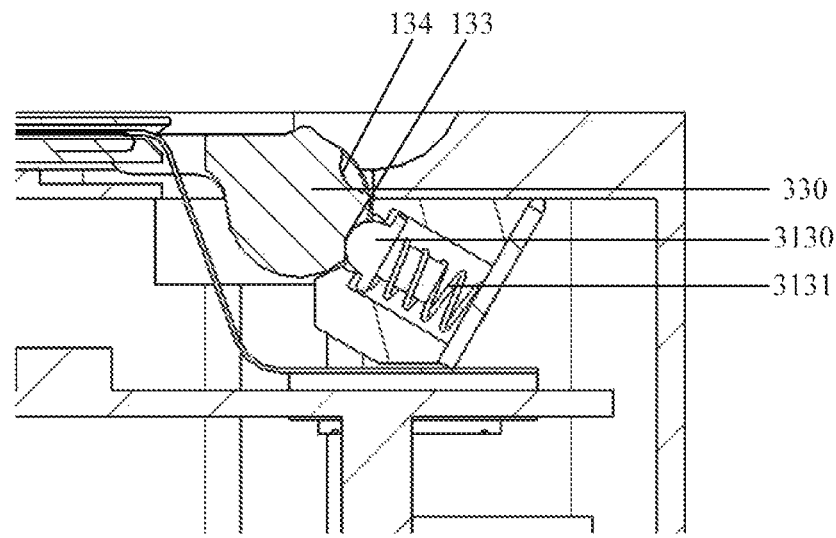
FIG. 3 is a sectional view illustrating a rotating shaft cooperates with a first spring pin component according to the present application.

FIG. 3 is a sectional view illustrating a rotating shaft cooperates with a first spring pin component according to the present application. A rotating shaft 330 is similar in structure to the rotating shaft 130, a spring pin 2130 is similar in structure to a spring pin 3130, and a spring 2131 is similar in structure to a spring 3131.

As shown in FIG. 2C, a spring pin component 213 includes a spring pin 2130 and a spring 2131, and further includes a spring pin fixed block 2132 and a spring fixing cover 2133. One end of the spring pin 2130 is approximately semi-ellipsoidal and the other end is two cylinders, and the spring 2131 is sleeved on one of the two cylinders, and the spring fixing cover 2133 is configured to block springs from falling out, and give reactive force when the springs are applied with pressure. A connection manner between the spring pin fixed block 2132 and the spring fixing cover 2133, and that of between the spring pin fixed block 2132 and the upper cover may be a threaded connection and the like. As shown in FIG. 2A and FIG. 3, a shape of a section perpendicular to the axis of the rotating shaft 330 of the first card slot 133 and the second card slot 134 is semicircular. A shape of a section perpendicular to the axis of the rotating shaft 330 of one end of the spring pin 3130 that cooperates with the first card slot 133 and the second card slot 134 is also semicircular.

As shown in FIG. 3, the first card slot 133 of the rotating shaft 330 cooperates with the spring pin 3130 when the preset angle is 0°. At this time, the spring 3131 is compressed, and a presence of an external force is required to rotate the support plate. When the rotating shaft rotates a certain angle clockwise, the second card slot 134 of the rotating shaft 330 will cooperate with the spring pin 3130, the spring 3131 is compressed, an elastic force of the spring is generated, and the elastic force may support the supporting plate at the certain angle with respect to the upper cover, so that it is convenient for visitors to visit exhibits on the support plate.

According to an embodiment of the present application, a box body further includes a lower cover, a mobile power source and a power source fixing cover, the lower cover is located under a upper cover, a third groove for placing the mobile power source is disposed on the power source fixing cover, and a magnet is disposed on the lower cover and the power source fixing cover. When there is no power source supply, the power source fixing cover on which the mobile power source is placed is absorbed onto the lower cover by the magnet.

Specifically, the lower cover is located under the upper cover, the mobile power source is located under the lower cover, and the power source fixing cover is located under the mobile power source. The box body may further include Direct Current (DC) control board disposed in the upper cover, and when there is an external power source, the display box may be powered by the DC control board. At this time, the mobile power source and the power source fixing cover may or may not exist. When there is no external power source, the mobile power source may power the display box, so that the display box does not limit the placement of the exhibits due to the geographic location of the power source. Further, a USB interface, a Type-c interface and the like may be disposed on any side of the box body to charge the mobile power source. A charging indicator may further be disposed on any side of the box body, so that it is possible to know whether the mobile power source is full by a color change of the charging indicator.

Figure 4:
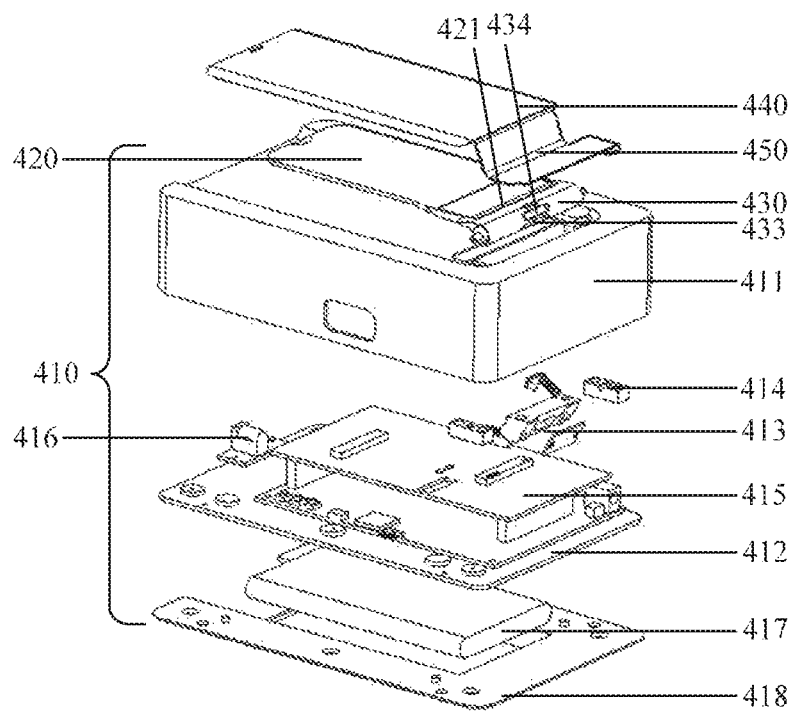
FIG. 4 is an exploded view illustrating a display box of a flexible screen according to the present application.

FIG. 4 is an exploded view illustrating a flexible screen display box according to the present application. Various components in FIG. 4 are similar in structure to various components of embodiments of FIG. 1 to FIG. 3.

As shown in FIG. 4, a flexible screen display box includes a box body 410, a support plate 420, a rotating shaft 430, a flexible screen 440, and an FPC 450, and the support plate 420 and the rotating shaft 430 are integrally formed.

Specifically, the box body 410 includes an upper cover 411, a lower cover 412, a spring bin component 413, two rotating shaft fixed blocks 414, a main board 415, a DC control board 416, and a mobile power source 417, and a power source fixing cover 418. A first groove 150 is disposed on the upper surface of the upper cover 411 and an opening 160 is disposed on the right side of the first groove for installing the support plate 420. The flexible screen 440 may be fixed on the support plate 420 and move together with the support plate 420 by using a double-sided tape and the like, and the support plate 420 and the flexible screen 440 may be loaded together into a rotating shaft structure corresponding to the upper cover 411 from an inner side of the upper cover 411. Two semi-ellipsoidal card slots parallel to the axial direction of the rotating shaft 430 are disposed on a middle part of a side surface of the rotating shaft 430. Two ends of the rotating shaft 430 have two symmetrical shaft necks, and the shaft necks at both ends of the rotating shaft 430 may be pressed by the two rotating shaft fixed blocks 414 to make the rotating shaft 430 be fixed in the upper cover 411, and the two rotating shaft fixed blocks 414 may be connected with the upper cover 411 by a threaded connection and the like.

A spring pin component 413 may further be disposed in the upper cover 411, and cooperates with card slots to control an angle between the support plate 420 and the upper cover 411, and the spring pin component 413 is fixed in the upper cover 411 by a threaded connection and the like. As shown in FIG. 2C and FIG. 3, the spring pin component 413 may include a spring pin 2130, a spring 2131, a spring pin fixed block 2132 and a spring fixing cover 2133.

A shape of a section perpendicular to the axis of the shaft of a first end of the spring pin 2130 is semi-circular. The spring pin 2130 cooperates with the card slots to restrict the angle between the support plate 420 and the upper cover 411. A second end of the spring pin 2130 may be cylindrical and the spring 2131 may be sleeved on the cylinder. A through hole is disposed on the spring pin fixed block 2132, and the spring pin 2130 and the spring 2131 may be installed into the through hole sequentially, and then the spring fixing cover 2133 is connected with the spring pin fixed block 2130 by a threaded connection and the like to fix the spring 2131, so that the spring 2131 will not fall out under an action of a force, and the spring pin fixed block 2132 and the upper cover 411 may also be connected by a threaded connection and the like. As shown in FIG. 3 and FIG. 4, when the support plate 420 is placed in a first groove 150, the first end of the spring pin 2130 cooperates with a first card slot 433 on the rotating shaft 430, at this time, the spring 2131 is compressed, and the support plate 420 is limited and fixed. As the support plate 420 rotates upward, the first card slot 433 and a second card slot 434 rotate clockwise, the first card slot 433 slowly moves away from the spring pin 2130, and the second card slot 434 slowly approaches the spring pin 2130. When the spring pin 2130 is snapped into the second card slot 434, the spring 2131 is compressed again, and the support plate 420 is confined again, so that the support plate 420 is at a certain angle with respect to the upper cover.

A main board 415, a DC control board 416 and the like may further be disposed in the upper cover 411 and may be fixed in the box body 410 sequentially. Since the FPC 450 is foldable, the FPC may insert into the upper cover 411 through a slit 421 and bend to be connected with the main board 415. When the box body 420 is powered, the main board 415 may control a display content of the flexible screen 440 by the FPC 450.

The lower cover 412 and the power source fixing cover 418 are respectively provided with a magnet, and a groove that may place a mobile power source 417 is disposed on the power source fixing cover 418. In the case of no other external power source, the mobile power source 417 may be placed in the groove of the power source fixing cover 418, and the mobile power source 417 is absorbed on the box body 410 by a mutual attraction of the magnets of the lower cover 412 and the power source fixing cover 418 to power the box body 410.

An embodiment of the present application further provides a display device including the display box described above and an exhibit, the exhibit is disposed on the support plate of the display box.

As shown in FIG. 4, a display device may include a box body 410, a support plate 420, a rotating shaft 430 and an exhibit 440. The support plate 420 is connected with the rotating shaft 430, and the rotating shaft 430 is rotatably connected with the box body 410, so that the supporting plate 420 may rotate a preset angle with respect to the rotating shaft 430. The exhibit 440 may be fixed on the upper or lower surface of the support plate 420. For example, when the exhibit 440 is fixed on the upper surface of the support plate 420, the preset angle may be greater than or equal to 0° and less than or equal to 90°; when the exhibit 140 is fixed on the lower surface of the support plate 120, the preset angle may be greater than or equal to 90° and less than 180°.

According to an embodiment of the present application, the support plate is disposed on the box body via the rotating shaft, so that the support plate and the upper surface of the box body may be at a preset angle. During a transportation process, the support plate and the exhibit may be at 0° with the upper surface of the box body, and the box body and the exhibit are protected from being bumped and damaged during the transportation process, so that the display device is relatively easy to be transported. During a display process, the exhibit may be at a certain angle with respect to the upper surface of the box body, so that visitors may visit the exhibit at a comfortable angle.

The above descriptions are merely preferred embodiments of the present invention, but not intended to limit the present invention. Any modification and equivalent replacement made without departing from the spirit and principle of the present invention shall fall within the protection scope of the present invention.

What is claimed is:

1. A display box, comprising:
   a box body comprising an upper cover;
   a rotating shaft rotatably connected with the upper cover; and
   a support plate disposed on the upper surface of the upper cover via the rotating shaft to fix an exhibit, the support plate being rotatable with the rotating shaft to make the exhibit be at a preset angle with respect to the upper surface;
   wherein the upper surface of the upper cover is further provided with an opening and the support plate extends through the opening to connect with the rotating shaft.

2. The display box according to claim 1, wherein the upper surface of the upper cover is further provided with a first groove, and the support plate is located in the first groove when the preset angle is 0°.

3. The display box according to claim 1, wherein
   the rotating shaft comprises a plurality of shaft necks located at both ends of the rotating shaft;
   the box body further comprises two rotating shaft fixed blocks, wherein a second groove is disposed on each of the two rotating shaft fixed blocks respectively, the second groove cooperates with each shaft neck at both ends of the rotating shaft respectively to make the shaft neck be disposed on the lower surface of the upper cover.

4. The display box according to claim 1, wherein the exhibit comprises a display screen disposed above the support plate;
   the box body further comprises a main board disposed in the upper cover, and the main hoard is connected with the display screen to drive the display screen to display.

5. The display box according to claim 4, wherein a slit is defined on the support plate; the display screen is connected with a flexible printed circuit; and the flexible printed circuit extends through the slit to connect with the main board.

6. The display box according to claim 1, wherein a first positioning slot and a second positioning slot are disposed along a circumferential direction of the rotating shaft with a preset distance;

the box body further comprises a first spring pin component disposed in the upper cover;
the first spring pin component cooperates with the first positioning slot when the preset angle is 0°;
the first spring pin component cooperates with the second positioning slot when the preset angle is greater than 0°.

7. The display box according to claim 6, wherein the first positioning slot and the second positioning slot are located in a middle part of the circumferential surface of the rotating shaft.

8. The display box according to claim 6, wherein the first positioning slot and the second positioning slot are located at one end of the rotating shaft, and the rotating shaft has a third positioning slot and a fourth positioning slot defined on another end thereof;

the box body further comprises a second spring pin component, the second spring pin component cooperates with the third positioning slot when the preset angle is 0°; the second spring pin component cooperates with the fourth positioning slot when the angle is greater than 0°.

9. The display box according to claim 6, wherein the first spring pin component comprises at least one spring pin and at least one spring corresponding to the spring pin;

one end of the spring pin cooperates with the first positioning slot or the second positioning slot, and the other end of the spring pin cooperates with the spring.

10. The display box according to claim 9, wherein a shape of a first section of the one end of the spring pin is semicircular, a shape of the other end of the spring pin is cylindrical, a shape of a second section of the first positioning slot and the second positioning slot is semicircular, and the first section and the second section are perpendicular to the axis of the rotating shaft.

11. The display box according to claim 9, wherein the support plate rotates upward, the first positioning slot rotates away from the spring pin, and the second positioning slot rotates toward the spring pin, when the spring pin is snapped into the second positioning slot, the spring is compressed, and the support plate is confined, so that the support plate is at a certain angle with respect to the upper cover.

12. The display box according to claim 1, wherein the box body further comprises a lower cover, a mobile power source and a power source fixing cover, the lower cover is located under the upper cover, a third groove for placing the mobile power source is disposed on the power source fixing cover, and the lower cover and the power source fixing cover are respectively provided with a magnet thereon, the power source fixing cover on which the mobile power source is placed is integrated onto the lower cover by the magnet.

13. A display device, comprising:
a display box; and
an exhibit disposed on a support plate of the display box, wherein the display box comprises:
a box body comprising an upper cover;
a rotating shaft rotatably connected with the upper cove; and
the support plate disposed on the upper surface of the upper cover via the rotating shaft to fix an exhibit, the support plate being rotatable with the rotating shaft to make the exhibit be at a preset angle with respect to the upper surface;
wherein the upper surface of the upper cover is further provided with an opening and the support plate extends through the opening to connect with the rotating shaft.

14. The display device according to claim 13, wherein the exhibit comprises a display screen disposed above the support plate:

the box body further comprises a main board disposed in the upper cover, and the main board is connected with the display screen to drive the display screen to display.

15. The display device according to claim 14, wherein a slit is defined on the support plate: the display screen is connected with a flexible printed circuit; and the flexible printed circuit extends through the slit to connect with the main board.

16. The display device according to claim 13, wherein a first positioning slot and a second positioning slot are disposed along a circumferential direction of the rotating shaft with a preset distance;

the box body further comprises a first spring pin component disposed in the upper cover;
the first spring pin component cooperates with the first positioning slot when the preset angle is 0'; the first spring pin component cooperates with the second positioning slot when the preset angle is greater than 0°.

17. The display device according to claim 16, wherein the first positioning slot and the second positioning slot are located in a middle part of the circumferential surface of the rotating shaft.

18. The display device according to claim 16, wherein the first positioning slot and the second positioning slot are located at one end of the rotating shaft, and the rotating shaft has a third positioning slot and a fourth positioning slot defined on another end thereof;

the box body further comprises a second spring pin component, the second spring pin component cooperates with the third positioning slot when the preset angle is 0°; the second spring pin component cooperates with the fourth positioning slot when the angle is greater than 0°.

19. The display device according to claim 16, wherein the first spring pin component comprises at least one spring pin and at least one spring corresponding to the spring pin:

one end of the spring pin cooperates with the first positioning slot or the second positioning slot and the other end of the spring pin cooperates with the spring.

20. The display device according to claim 19, wherein a shape of a first section of the one end of the spring pin is semicircular, a shape of the other end of the spring pin is cylindrical, a shape of a second section of the first positioning slot and the second positioning slot is semicircular, and the first section and the second section are perpendicular to the axis of the rotating shaft.

* * * * *